(12) United States Patent
Lee

(10) Patent No.: US 7,589,027 B2
(45) Date of Patent: Sep. 15, 2009

(54) METHOD OF MANUFACTURING SEMICONDUCTOR DEVICE

(75) Inventor: Young Seong Lee, Anyang-Si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 125 days.

(21) Appl. No.: 11/616,049

(22) Filed: Dec. 26, 2006

(65) Prior Publication Data

US 2007/0148989 A1    Jun. 28, 2007

(30) Foreign Application Priority Data

Dec. 28, 2005   (KR) .................. 10-2005-0132677

(51) Int. Cl.
*H01L 21/31* (2006.01)
*H01L 21/469* (2006.01)
(52) U.S. Cl. .............. 438/776; 438/799; 438/792; 257/E21.292; 257/E21.489
(58) Field of Classification Search .............. 438/783, 438/776, 792, 799, 909; 257/E21.292, E21.302, 257/E21.489
See application file for complete search history.

(56) References Cited

U.S. PATENT DOCUMENTS

| | | | | |
|---|---|---|---|---|
| 6,475,862 | B1 * | 11/2002 | Ando ........................ | 438/264 |
| 2003/0170956 | A1 * | 9/2003 | Zhong et al. ............... | 438/287 |
| 2004/0214398 | A1 * | 10/2004 | Chen et al. ................. | 438/275 |
| 2005/0003597 | A1 * | 1/2005 | Han et al. .................. | 438/197 |
| 2005/0164444 | A1 * | 7/2005 | Burnham et al. ........... | 438/232 |

* cited by examiner

*Primary Examiner*—Caridad M Everhart
(74) *Attorney, Agent, or Firm*—Saliwanchik, Lloyd & Saliwanchik

(57) ABSTRACT

Provided is a method of manufacturing a semiconductor device. A first gate oxide layer is formed on a semiconductor substrate in which a core region and an input/output region are defined. The first gate oxide layer of the core region is selectively removed, and a second gate oxide layer is formed under the first gate oxide layer of the input/output region and on the semiconductor substrate of the core region. Nitrogen annealing is performed to form a nitrogen-rich oxide layer under the second gate oxide layer. An additional thermal process is performed to diffuse nitrogen segregated on an interface between the first gate oxide layer and the second gate oxide layer of the input/output region to a surface of the semiconductor substrate. Impurities generated during the additional thermal process are discharged to the outside.

3 Claims, 3 Drawing Sheets

METHOD OF MANUFACTURING SEMICONDUCTOR DEVICE

RELATED APPLICATION(S)

This application claims priority under 35 U.S.C. §119(e) of Korean Patent Application No. 10-2005-0132677 filed Dec. 28, 2005, which is incorporated herein by reference in its entirety.

FIELD OF THE INVENTION

The present invention relates to a method of manufacturing a semiconductor device.

BACKGROUND OF THE INVENTION

Even though a fine line width is inevitably required in manufacturing a highly integrated semiconductor device, the operation voltage is fixed by the application specification.

For this reason, it can be complicated to provide a process design and a manufacturing condition for maintaining device reliability such as hot carrier injection (HCI) and negative bias temperature instability (NBTI). In particular, under the conditions of a 'NO' gate insulating layer having a single structure for PMOS and NMOS devices, the HCI and NBTI characteristics show opposite tendency according to an influence of nitrogen. Hence, the process design and manufacturing condition are expected to reach a limit.

A recent development incorporates a gate oxide layer of a semiconductor device including a core region and an input/output region (hereinafter, referred to as an 'I/O region') having two different thicknesses according to an operation voltage.

FIGS. 1A through 1B are views illustrating a method of forming a related art gate insulating layer of a semiconductor device.

Referring to FIG. 1A, a first gate oxide layer 12 is grown on an entire surface of a semiconductor substrate 11 including a field oxide layer (FOX) through a first gate oxidation process.

Referring to FIG. 1B, a photoresist layer 13 masks an I/O region during a wet etch process to the first gate oxide layer 12 in the core region.

Referring to FIG. 1C, the photoresist layer 13 is removed, and a second gate oxidation process is performed to grow a second gate oxide layer 14 with a thin thickness on the semiconductor substrate 11 in the core region. Here, as for the I/O region, since the oxidation is further performed under the first gate oxide layer 12 and thus the second gate oxide layer 14 is formed, a thick gate oxide layer including the first gate oxide layer 12 and the second gate oxide layer 14 is formed in the I/O region.

Thereafter, referring to FIG. 1D, nitrogen annealing is performed to form a nitrogen-rich (N-rich) oxide layer 15 including a large amount of nitrogen on an interface between the semiconductor substrate 11 and each of the gate oxide layers. A gate oxide layer structure including the N-rich oxide layer 15 is called a 'NO' gate oxide layer.

The Si—N bond made when the N-rich oxide layer 15 is formed in the NO gate oxide layer is well known for its strong resistance to a hot carrier.

However, the dual gate oxide layer structure using a nitride oxide layer has problems of trapping charge formation caused by nitrogen segregation within an oxide layer of an I/O PMOS. This trapping charge works as an obstacle in a subsequent process. That is, nitrogen trapping occurs on an interface between the first gate oxide layer and the second gate oxide layer.

When exposed to strong plasma during dry etching in a subsequent Back End of the Line (BEOL) process, nitrogen trapped on the interface may work as a site of a static charge generation by hole generation.

In general, to prevent such a phenomenon, a gate electrode is connected to an active region to distribute an impact from the design view, and condition control is made to minimize an impact of plasma from the process view.

However, the performance deterioration of a transistor is unavoidable if the design capacity with respect to impact distribution of static electricity is limited and it is difficult to set a process condition for lowering the plasma impact.

The deterioration of a PMOS transistor caused by static charges causes a threshold voltage increase (Vth increase), a saturated current reduction, and an Off leakage increase due to vertical electric field reduction.

BRIEF SUMMARY

Accordingly, the present invention is directed to a method of manufacturing a semiconductor device that may substantially obviate one or more problems due to limitations and disadvantages of the related art.

An object of embodiment of the present invention is to provide a method of manufacturing a semiconductor device capable of minimizing or preventing static charge generation caused by nitrogen segregation occurring on an interface of gate insulating layers formed through a thermal process of an I/O region when a NO gate insulating layer is implemented.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method of manufacturing a semiconductor device, including: forming a first gate oxide layer on a semiconductor substrate in which a core region and an input/output region are defined; selectively removing the first gate oxide layer of the core region; forming a second gate oxide layer under the first gate oxide layer of the input/output region and on the semiconductor substrate of the core region; performing nitrogen annealing to form a nitrogen-rich oxide layer under the second gate oxide layer; performing an additional thermal process to diffuse nitrogen segregated on an interface between the first gate oxide layer and the second gate oxide layer of the input/output region to a surface of the semiconductor substrate; and discharging impurities generated during the additional thermal process to the outside.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE INVENTION

Reference will now be made in detail to the preferred embodiments of the present invention, examples of which are illustrated in the accompanying drawings.

FIGS. 2A to 2D are views illustrating a method of manufacturing a semiconductor device according to an embodiment of the present invention.

Figure 1A:
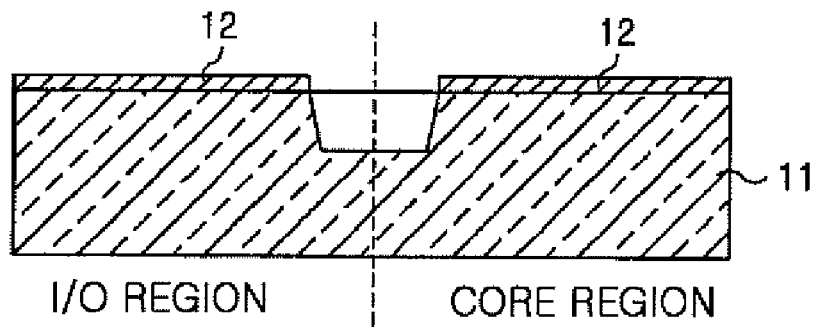
FIGS. 1A through 1D are views illustrating a method of forming a gate insulating layer of a semiconductor device according to the related art.
Figure 1B:
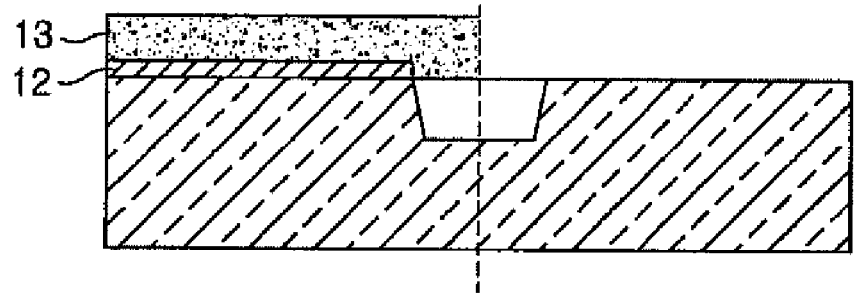
Figure 1C:
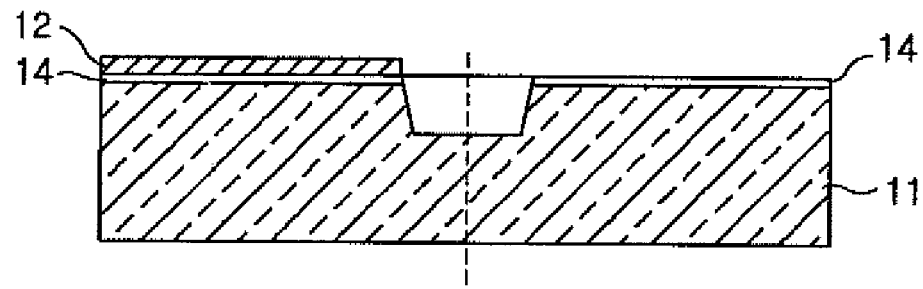
Figure 1D:
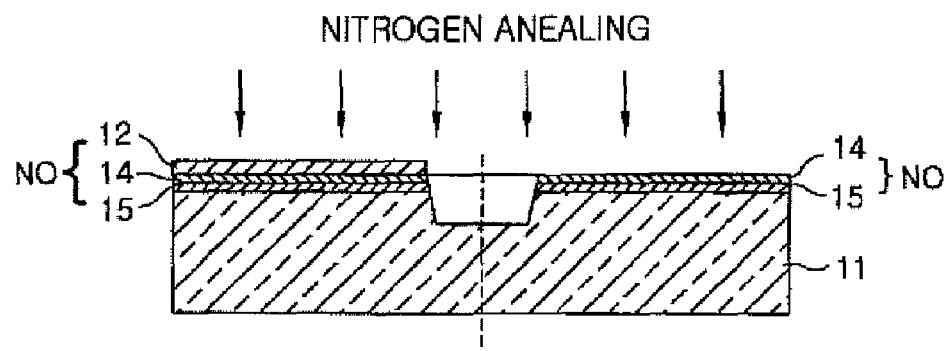
Figure 2A:
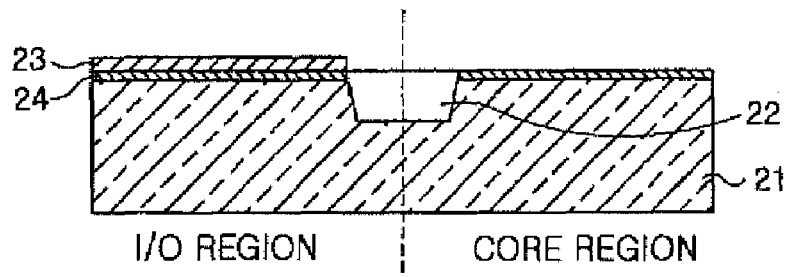
FIGS. 2A through 2D are views illustrating a method of manufacturing a semiconductor device according to an embodiment of the present invention.

Referring to FIG. 2A, ion injection can be performed to form a well (not shown) in a semiconductor substrate 21 including a field oxide layer 22 formed by a shallow trench isolation (STI) process. Thereafter, a first gate oxide layer 23 can be grown on an active region of the semiconductor substrate 21 using a furnace.

The first gate oxide layer 23 in the core region can be removed by a wet etch while masking the I/O region.

Thereafter, a second oxide layer 24 having a thin thickness can be grown on the core region using a furnace. In the I/O region, the second gate oxide layer 24 is formed under the first gate oxide layer 23 by performing the second gate thermal process. Accordingly, a thick gate insulating layer having a double-layered structure formed of the first gate oxide layer 23 and the second gate oxide layer 24 can be formed in the I/O region, while only a single layer of the second gate oxide layer 24 having a thin thickness is formed in the core region.

The thickness of the second gate oxide layer 24 formed in the core region can be set to be thinner than a target by about 1 Å by considering an oxide layer growth process that is to be repeated after a subsequent nitrogen annealing.

Figure 2B:
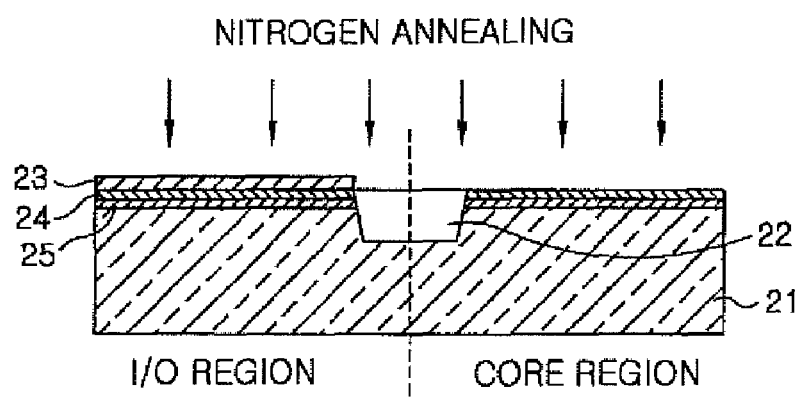

Referring to FIG. 2B, a nitrogen monoxide (NO) gas can be injected into a chamber to perform a nitrogen annealing process.

When the nitrogen annealing is performed, an N-rich oxide layer 25 can be formed on an interface between the second gate oxide layer 24 and the semiconductor substrate 21 in both the core region and the I/O region. Although most of the nitrogen is formed on the N-rich oxide layer 25 of the interface between the second gate oxide layer 24 and the semiconductor substrate 21, a portion of the nitrogen is inevitably segregated onto an interface between the first gate oxide layer 23 and the second gate oxide layer 24. The segregated nitrogen exists in an unstable state, and thus has a possibility of working as a site of hole generation during a subsequent plasma process.

Therefore, in embodiments of the present invention, the following process is further performed in order to stabilize segregated nitrogen.

Figure 2C:
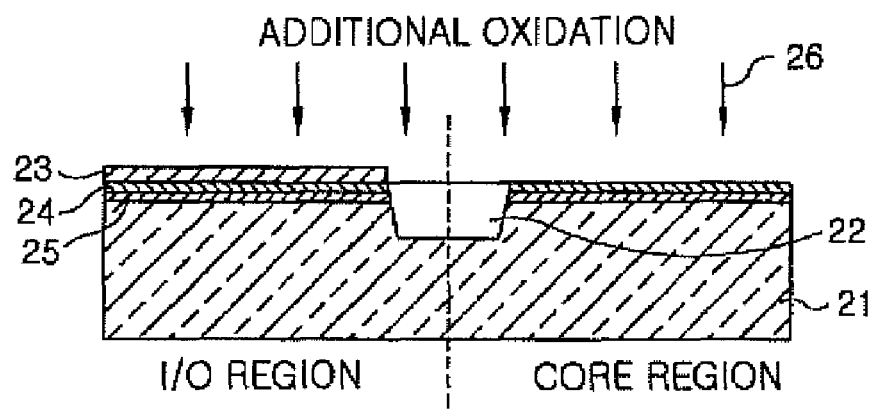

First, referring to FIG. 2C, an additional thermal process 26 can be performed after the nitrogen annealing. The purpose of the additional oxidation process 26 is to induce a Si—N stabilized structure by diffusing surplus nitrogen segregated on the interface between the first gate oxide layer 23 and the second gate oxide layer 24 toward the interface between the second gate oxide layer 24 and the semiconductor substrate 21.

Here, since the N-rich oxide layer 25 works as a barrier against oxygen penetration, oxide-layer growth occurs to an extremely small extent so that the insufficient thickness of the second gate oxide layer can be compensated by about 1 Å.

Figure 2D:
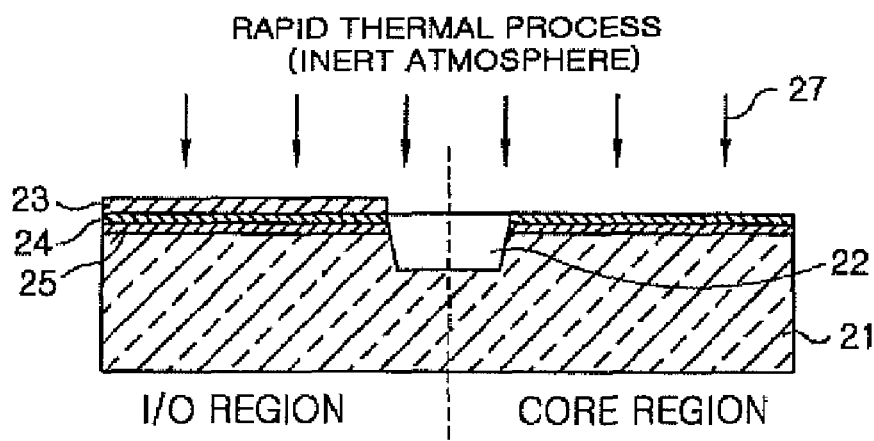

Thereafter, referring to FIG. 2D, a rapid annealing, namely, a rapid thermal process (RTP) 27, can be performed under an inert atmosphere. In an embodiment, the RTP can be performed at a temperature ranging from 800 to 1000° C.

The RTP 27 can be performed in order to discharge impurities, such as OH, which are substituted by a Si—N bond in the additional thermal process 26, to the outside.

Although not shown, subsequent processes for a gate electrode, a lightly doped drain (LDD), a spacer, junction ion implantation, and silicide can be performed to complete a construction of a transistor.

According to the present invention as described above, nitrogen segregated in an unstable state on an interface of a double oxide layer in the I/O region can be cured into a stabilized state through an additional thermal process for a semiconductor product having a PMOS transistor including a NO gate oxide layer. Also, because the RTP is performed under the inert atmosphere, impurities can be discharged to the outside, performance deterioration of a transistor due to static charge formation during a subsequent process can be prevented from occurring.

In addition, resistance to NBTI caused during a continuous use of a product can be increased, while deterioration of an I/O PMOS transistor caused by a process influence of plasma or the like can be prevented.

It will be apparent to those skilled in the art that various modifications and variations can be made in the present invention. Thus, it is intended that the present invention covers the modifications and variations of this invention provided they come within the scope of the appended claims and their equivalents.

I claim:

1. A method of manufacturing a semiconductor device, method:

forming a first gate oxide layer on a semiconductor substrate in which a core region and an input/output region are defined;

selectively removing the first gate oxide layer of the core region;

forming a second gate oxide layer under the first gate oxide layer of the input/output region and on the semiconductor substrate of the core region, wherein the second gate oxide layer is formed with a thickness almost to a target thickness;

performing nitrogen annealing to form a nitrogen-rich oxide layer under the second gate oxide layer;

performing an additional thermal process to diffuse nitrogen segregated on an interface between the first gate oxide layer and the second gate oxide layer of the input/output region to a surface of the semiconductor substrate, wherein any difference between the thickness of the second gate oxide layer and the target thickness is compensated for during performing the additional thermal process; and discharging impurities generated during the additional thermal process to an outside, wherein discharging impurities generated during the additional thermal process to the outside comprises performing a rapid thermal process under an inert atmosphere.

2. The method according to claim 1, wherein the rapid thermal process is performed at a temperature ranging from 800 to 1000° C.

3. The method according to claim 1, wherein performing nitrogen annealing comprises injecting a nitrogen monoxide (NO) gas.

* * * * *